United States Patent [19]

Klein

[11] 4,323,421

[45] Apr. 6, 1982

[54] FABRICATION OF CONDUCTOR-CLAD COMPOSITES USING MOLDING COMPOUNDS AND TECHNIQUES

[75] Inventor: Theodore H. Klein, Livingston, N.J.

[73] Assignee: Bell Telephone Laboratories, Incorporated, Murray Hill, N.J.

[21] Appl. No.: 121,821

[22] Filed: Feb. 15, 1980

Related U.S. Application Data

[63] Continuation of Ser. No. 900,937, Apr. 28, 1978, abandoned.

[51] Int. Cl.³ .................... B32B 31/06; B32B 31/24; H05K 3/06
[52] U.S. Cl. .................... 156/630; 29/846; 29/848; 264/241; 264/259; 264/DIG. 64
[58] Field of Search ............... 156/630; 264/241, 255, 264/259, 299, 319, DIG. 64; 174/68.5; 29/846, 848

[56] References Cited

U.S. PATENT DOCUMENTS

| | | | |
|---|---|---|---|
| 3,079,645 | 8/1963 | Cosmos | 264/259 |
| 3,505,141 | 4/1970 | Sorensen et al. | 156/245 |
| 3,784,664 | 1/1974 | Nicklin | 264/255 |
| 3,889,363 | 6/1975 | Davis | 29/848 |
| 4,023,998 | 5/1977 | Cederberg | 156/630 |

Primary Examiner—Jerome W. Massie
Attorney, Agent, or Firm—Peter V. D. Wilde; Samuel H. Dworetsky

[57] ABSTRACT

Conductor-clad composites are advantageously fabricated using molding compounds and associated processing techniques. The conductive cladding is applied and bonded to the composite during the molding process. The conductor-clad composite may be used as printed wiring board, and in this embodiment results in improved physical, chemical, mechanical, and electrical properties.

17 Claims, 1 Drawing Figure

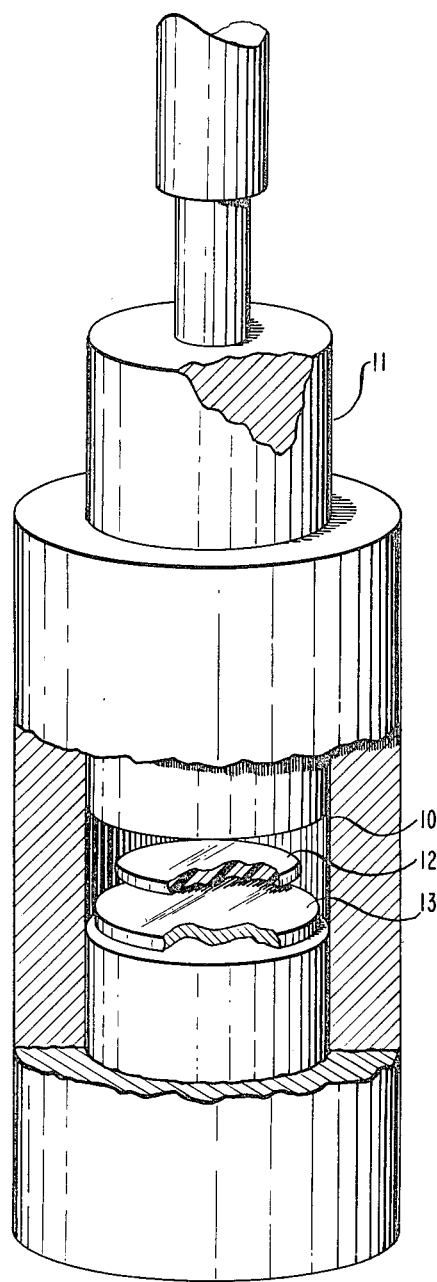

FABRICATION OF CONDUCTOR-CLAD COMPOSITES USING MOLDING COMPOUNDS AND TECHNIQUES

This application is a continuation of application Ser. No. 900,937 filed Apr. 28, 1978, now abandoned.

BACKGROUND OF THE INVENTION

1. Field of the Invention

This invention involves the fabrication of conductor-clad composites using molding compounds and associated molding techniques.

2. Description of the Prior Art

Despite the advent of integrated circuitry, the much larger scale printed wiring board technology is still in very substantial use in those areas where miniaturization is not critical. A prevalent technique for fabricating copper-clad composites, especially those composites which are used as printed wiring board, involves the manufacture of resin-impregnated woven reinforcement. Subsequent to impregnation of the woven reinforcement with an appropriate resinous compound, the material is passed through a heated oven where the polymer in the resinous compound is caused to partially crosslink thereby yielding a somewhat tacky structure commonly referred to as a "prepreg". The prepreg is cut to appropriate size and a number of such sheets are pressed in a suitable open platen laminating press at pressures of from 15 to 300 pounds per square inch (psi) and at temperatures of from 250–550 degrees Fahrenheit for approximately an hour. The laminating process may involve simultaneously the application of an appropriate conductive foil sheet (e.g., copper) to one or both sides of the substrate, upon which a printed circuit may be subsequently defined. Any vapors that form during the laminating process may escape through the side openings in the open platen press, and consequently, have little deleterious effect upon the bonding of the copper and its resultant smoothness. This laminating technique requires a significant amount of time (approximately one hour) due to the lengthy layup and curing steps. Material costs, primarily associated with the woven glass reinforcement, and the lengthy processing time make the cost of the product prohibitive for many applications.

Suggestions for lowering the cost of copper-clad composites include the use of bulk molding compound to form an appropriate substrate to which a conductive cladding is subsequently bonded (see, for example, *Insulation Circuits*, November 1976, page P-41). Such a process, however, retains the costly dual-step nature of the prior process (i.e., substrate fabrication and subsequent bonding). In addition, use of the resultant conductor-clad composite as printed wiring board has been largely unsuccessful, in part, for lack of proper physical, mechanical, electrical, and chemical properties.

The pultrusion process has recently been applied to the single-step fabrication of copper-clad composites (see U.S. Pat. No. 4,012,267). The good quality of the copper bond in the pultrusion process is due partly to the "open" nature of the pultrusion press which allows for venting of vapors produced during curing. While the single-step pultrusion process is highly effective, cost reduction is still an object of significant pursuit.

SUMMARY OF THE INVENTION

This invention is a method of fabricating conductor-clad composites using polymeric molding compounds and associated molding techniques. The conductive cladding is bonded to the composite in a single molding-bonding step. The single-step nature of this process, when combined with the inherent cost reduction obtained through the use of "filled" molding compounds, results in a potential cost reduction of approximately 50 percent when compared to prior art copper-clad composites. Specific formulations may be advantageously used when the clad composite is to be applied to the fabrication of printed wiring board. The use of this process in conjunction with such specific formulations results in a printed wiring board with physical, mechanical, electrical, and chemical properties equal to, or superior to, that obtained in the prior art, while providing significant cost reduction.

BRIEF DESCRIPTION OF THE DRAWING

The FIGURE is a schematic representation of a molding apparatus which may be utilized to fabricate the conductor-clad composite.

DETAILED DESCRIPTION

This invention is a process for fabricating clad composites using polymeric molding compounds and associated molding techniques. Conductor-clad composites fabricated using this process may be advantageously utilized in the fabrication of printed wiring board.

A. The Molding Process

The inventive process involves molding an appropriate polymeric molding compound in a heated molding apparatus while simultaneously applying at least one conductive foil to the compound. While the formulation of the molding compound may proceed by any one of a number of different processes, the molding step is generally the same for all molding compounds. This molding step utilizes a standard press fitted with a heated compression mold familiar to those skilled in the art and shown schematically in the FIGURE. The compression mold comprises a heated female member, or cavity, 10 which may be fitted with an appropriate heated male member, or core, 11. The heated cavity 10 is filled with a charge of the molding compound 12, and at least one conductive foil 13, subsequent to which the mold is closed. The closure of the press proceeds at a controlled rate depending on the reactivity of the compounds.

B. The Resin Formulation

While the inventive molding process is broad enough to encompass the use of a number of different molding compounds (e.g., sheet molding compound, bulk molding compound, thick molding compound), the following discussion is presented in the context of a specific sheet molding compound formulation in order to more easily detail the various facets of this invention.

Table I is an example of a typical sheet molding compound formulation and includes ranges for the various constituents of the formulation which are meant to be broad enough to encompass all molding compounds. Table II reviews the properties of a conductor-clad composite fabricated according to the teachings of this invention. Following the tables is a discussion of the various elements of the formulation.

TABLE I

FORMULATION OF MOLDING COMPOUND

| | Formulation (pts by wt ±5%) | Range (pts by wt) |
|---|---|---|
| Resin (polymeric portion) | 65.0 | 60–80 |
| Monomer | 43.0 | 0.5–60 |
| Low Profile Additive | 35.0 | 15–40 |
| Catalyst | 1.5 | 0.5–3 |
| Filler | 150.0 | 100–200 |
| Viscosity Control Agent | 2.5 | 0–5 |
| Reinforcement | 85.0 | 20–250 |

TABLE II

PROPERTIES OF THE CLAD COMPOSITE

| PROPERTY | TEST & CONDITION | RESULT |
|---|---|---|
| Solvent Sensitivity | | |
| Trichloroethylene | 5 minutes in boiling vapor | No visible signs of solvent attack |
| Methylene Chloride | 15 miuntes soak at room temperature | |
| Chemical Degradation | Exposed to chemicals used in printed wiring board processing | No visible signs of degradation |
| Solder Dip Resistance | Immerse in 500 degrees F. molten solder for 30 seconds | No blisters or conductor lift |
| Water Absorption | 24-hour immersion in tap water at room temperature | 0.35 percent typical 0.70 percent maximum |
| Combustibility | Oxygen index (ASTM 2863) | 32 percent typical 28 percent minimum |
| | Underwriters Labs (#UL-94) | 94V-0 |
| Surface Roughness | Profilimeter | 20$\mu$ inches maximum |
| Peel Strength | 90 percent peel at room temperature | 3 lbs/inch conductor width typical 2 lbs/inch conductor width minimum |
| Barcol Hardness | Barcol Impressor Model GYZJ 934-1 | 55 Barcol Hardness typical 40 Barcol Hardness minimum |
| Flexural Strength | ASTM D790 | $23 \times 10^3$ psi typical $17 \times 10^3$ psi minimum |
| Modulus of Elasticity | ASTM D790 | $1.7 \times 10^6$ typical $1.0 \times 10^6$ minimum |
| Impact Strength | | 5 foot pounds |
| Insulation Resistance | ASTM D257 (interlocking comb pattern exposed to 95 degrees F. and 90 percent humidity) | After 4 days = $6.0 \times 10^5$ megohms After 11 days = $3.0 \times 10^5$ megohms After 28 days = $2.5 \times 10^5$ megohms |

1. Resin

In this invention the resin is usually a thermosetting polymeric resin although high temperature thermoplastics may be used. In order to eliminate blistering of the cladding during the molding process, it is advantageous that the resin cure with minimal occurrence of condensation reactions. By-products which form during such reactions could stimulate blistering and degrade the product to a point where it would be undesirable for the application envisioned. Specifically, such reactions may result in reduced peel strength and degraded electrical properties.

Exemplary resins used in this invention include isophthalic anhydride based unsaturated polyester resins, such as HATCO LB555-44 or PPG Selectron 50239; vinyl ester based resins, such as Dow Chemical, DER 786; orthophthalic anhydride based unsaturated polyester resins, such as HATCO GR 63003; and bisphenol based polyester resins, such as ATLAC 382. (The commercial resins are exemplary formulations familiar to those skilled in the art, however, the generalized resin description is sufficient to allow one skilled in the art to practice this invention. It should be noted that some of the commercially available resins may include some monomer.) At the current time phenolic resins used in laminating processes are known to cure only by means of a condensation reaction and during the molding process give off water vapor which could cause blistering of the copper cladding and voids in the composite. Phenolic resins may, however, be used where the vapors formed during the cure are adequately vented. Epoxy resins which are thermosetting may also be used in this invention. The chemical engineering involved in fabricating the resin is a highly complicated problem well known to those skilled in the art.

2. Monomer

The monomer is a crosslinking member which forms a three-dimensional network with the polymeric portion of the resin formulation. Different monomers may be advantageously utilized depending upon the specific resin formulation used. The monomer also has the effect of reducing the viscosity of the formulation during the mixing process so as to increase the subsequent wetting of the reinforcement material by the resin formulation. Typical monomers are styrene and diallyl phthalate. In the work described in this specification, styrene was widely used as the monomer.

3. Low Profile Additive

The low profile additive results in increased surface smoothness and increased dimensional stability of the resultant composite. Generally, as the temperature increases during the molding process and the resin cures, the resin shrinks around the glass reinforcement at the fiber-resin interface resulting in fiber prominences at the composite surface. The low profile additive is incompatible with the resin at these molding temperatures. Consequently, a phase separation occurs during whch time the generally thermoplastic low profile additive separates from the resin phase, absorbs a portion of the monomer, and expands. It is theorized that the expanding low profile additive acts as a restraint to the shrinking resin. The resin, consequently, does not shrink around the fiberglas reinforcement, and reinforcement prominences are minimized yielding the improved surface smoothness observed in the composite. Both polystyrene and polyvinyl acetate low profile additives were used during various phases of this work. In Example 1 a specific formulation is noted in which polyvinyl acetate is found to give improved results.

The glass transition temperature and the coefficient of thermal expansion of the low profile additive may be advantageously chosen so as to maximize the additive's effect during the molding process. In Example 1 this effect is maximized so as to yield particularly beneficial results. However, different low profile additives may be selected depending upon the specific resin formulation utilized during the practice of this invention.

4. Catalyst

The catalyst initiates crosslinking between the polymer and the monomer. The specific catalyst or catalysts which are used in a particular formulation is determined in part by the temperature which is selected for the molding process. In the work described in Example 1 both tertiary butylperbenzoate, as well as a peroxyketal (Noury Chemical Tirgonox 29, i.e., 1,1 dibutylperoxy 3,5,5 trimethyl cyclohexane) were used as catalysts. However, other catalysts, or mixtures of catalysts, may be used depending upon the temperature selected for use during the molding process.

5. Filler

The filler material is generally a material which does not play a reactive part during the curing of the molding compound. It is selected for its low cost and for other characteristics which may improve the properties of the resultant clad composite. In most instances the filler will be a nonpolymeric material.

Alumina trihydrate is a particularly beneficial filler in that it retards flammability. The alumina trihydrate used in Example 1 was treated with a silane prior to its inclusion in the formulation in order to maintain the resultant viscosity of the compound, which normally increases as the amount of alumina trihydrate is increased. The silane treatment, and the resultant viscosity properties, permit better wetting of the reinforcement by the resin portion of the formulation and consequently allows for the inclusion of greater amounts of filler than would normally be possible. Exemplary fillers include clays, calcium carbonate, and reground or reprocessed thermosetting materials which may have been fully cured.

6. Viscosity Control Agent

The viscosity control agent increases the viscosity of the compound from approximately 3000 cps to 50 million cps during the maturation which occurs prior to molding. This need not be a crosslinking process, and the viscosity control agent is generally not a crosslinking agent. The primary use of the viscosity control agent is to increase the viscosity of the compound so that it may be handled more readily prior to placement in the mold. It is particularly beneficial in the sheet molding process where sheets of the molding compound are formed for placement into the mold as integral units. However, when bulk molding compound or thick molding compound is used and such handling of the material is not necessary the viscosity control agent may be removed from the formulation. Typical viscosity control agents include magnesium oxide and magnesium hydroxide.

7. Reinforcement

The preferred reinforcement material is usually glass fiber generally of a diameter of from 10-1000 microns. While the fiber reinforcement may be continuous, typically it is not. Its length is dependent both upon the properties which are desired for the ultimate clad composite and also the particular type of molding compound which is utilized. So for example, the longer the fiber reinforcement the greater the strength of the resultant composite. While the sheet molding and the thick molding compound may contain glass fibers of from 1-4 inches, the bulk molding compound, by the nature of the mixing process, will result in glass fibers generally no longer than a quarter of an inch. Consequently, the use of bulk molding compound may yield a composite which has lower strength than that obtained with the sheet molding and thick molding compounds.

The fiber, preferably prior to its being chopped, may be treated with a coupling agent so as to increase the bond between the resin and the glass fiber. Such a resin compatible treatment may include coating with a silane, with VOLAN or GARAN. The fiber reinforcement is not limited to glass fibers but may also include graphite fibers, carbon fibers, polyaromatic amid fibers, polyester fibers, cellulose fibers, or any other appropriate reinforcement. In some sheet molding embodiments some continuous fiber strands may be used. In some embodiments in which strength is not critical the reinforcement may be entirely omitted.

C. The Molding Parameters

The molding parameters may be dependent on the size of the mold and size of the charge. However, generally the molding process involves molding the compound in a mold which has been brought to temperature prior to insertion of the molding compound. As discussed above, since the inventive process yields a conductor-clad composite it includes placing at least one conductive foil into the mold prior to insertion of the molding compound into the mold. Molding temperatures may vary from 200-500 degrees F., with typical values for molding compounds in the neighborhood of $285 \pm 30$ degrees F. Pressure in the range from 100-1500 psi are possible but are usually in the range of 800-1100 psi.

Since this is a rapid process typically with a cycle time of 1-5 minutes, the rate of closure must be relatively rapid in order to ensure proper flow of material prior to curing. Closure usually occurs within a period of 15 seconds; and if a movement mold is used, any gases that are formed must be allowed to escape during this time since gases cannot escape once such a mold is closed. During the molding process (a period generally of from 1-5 minutes) the mold remains heated; and while it may be cooled down prior to removal of the molding compound, the most economical embodiments involve retention of the mold at approximately full heat during insertion and during subsequent removal of the cured composite. The composite is removed from the mold by means of an appropriate jet of air, knockout pins, or, in certain embodiments, through the use of additional suction cups.

Care should be taken while removing the composite to ensure that it is not distorted. It may be desirable in certain embodiments to restrain the composite in an appropriate fixture during cooling in order to limit distortion of the composite. However, with the low profile additives suggested in the example restraint of the composite subsequent to molding is usually not necessary.

The size of the molding charge is usually on the order of 8 ounces per square foot (for a 0.060 inch thick composite) and usually covers from 30-90 percent of the mold surface and inserted. In commercial embodiments this number will usually be between 50 and 80 percent. It has been observed in this work that if the charge fills the entire area of the mold, when inserted, then the inability of the charge to move during the molding process results in trapping of volatile products and resultant blistering of the clad composite. When sheet molding compound is used, an appropriate charge configuration may be established by placing a number of sheets in the press one on top of the other. In certain embodiments the use of a pyramidal charge pattern may be preferable.

The clad composite may be made with either one or two surfaces clad with an appropriate conductor such as copper. When copper is used the surface which contacts the molding compound is generally pretreated to increase the bond strength between the copper and the molding surface. Such treatment may include a brass flash, a zinc flash, an oxide treatment, or an appropriate adhesive treatment. It is found that if the copper foil is the size of the mold surface area then expansion during the molding process results in severe wrinkling of the copper (i.e., folds on the composite). Consequently, it is important that the copper be approximately centered in the mold and have linear dimensions (i.e., length, width) at least one-hundredth of a percent less than the internal linear dimensions of the mold face. Generally, the copper will be between one-tenth of a percent and five percent less than the linear dimensions of the mold face. In commercial embodiments the linear dimensions of the foil will be between one percent and three percent of the mold face.

The copper is usually in the range from one-quarter to five-ounce copper (0.35 to 7 mils thick) and is usually either electro-deposited or rolled copper. Lower thicknesses of copper, such as eighth-ounce copper, may be advantageously utilized when, subsequent to the composite formation, a circuit is defined on the thin copper and then additional copper is deposited electrolessly on the defined circuit to build up a layer of copper thick enough for commercial embodiments. In this specification, this process will be referred to as the partially additive process.

The tendency of the molding compound to adhere to the face of the compression mold influences the operating parameters used in the course of this invention. Two illustrative points involve (1) the fabrication of a composite with only a single cladding, and (2) the requirement of an undersized cladding.

If the composite is fabricated with only a single cladding consideration must be given to the tendency of the unclad side to adhere to the mold face during molding. In prior art applications in which the peel strength of the single cladding is not critical, internal mold release may be used in the formation of the molding compound. Such a mold release significantly reduces the tendency of the molding compound to adhere to the mold. However, in view of the fact that the internal mold release also restricts the adherence of the cladding to the substrate, and consequently reduces its peel strength, such internal mold release will not generally be used in the practice of this invention. Alternative techniques applicable to this invention involve spraying an external mold release on the mold surface, or using an appropriate plastic film, such as Mylar, to prevent the deleterious adherence.

In a similar vein, if the conductive cladding—which is required to be less than the size of the interior mold face according to the teachings of this invention—is made too small then the large amounts of exposed molding compound will adhere to the mold face presenting significant difficulties. This invention is properly practiced with a conductive cladding which, though undersized, is still sufficiently large so as to limit the amount of molding compound exposed to the molding face thereby avoiding adherence of the molding compound to the mold face.

Subsequent to formation of the composite an appropriate electrical circuit may be defined using techniques well known in the art.

D. Composite Characteristics

1. Surface Characteristics

Using this process, conductor-clad composites with desirable characteristics may be formed in a single molding step. For example, it is found that the surface characteristics of the printed wiring board are improved over those available in the prior art. Specifically, the fiber prominences in the composite, when measured using a tally profilimeter, are less than 20 microinches rms and in many embodiments less than 17.5 microinches rms. For comparison, conductor-clad composites with woven fiberglass reinforcement usually have surface variations greater than 20 microinches rms. Part of this improvement may be attributed to specific properties of the invention described here. For example, a woven reinforcement is generally not used. Woven reinforcement usually involves a cloth which has associated with it fiber prominences which appear at the fiber crossover points. This invention utilizes unwoven chopped glass fiber less than four inches in length which is embedded in the resin compound thereby avoiding any deleterious effect on the surface characteristic of the subsequent printed wiring board. In addition, low profile additives are used which significantly further improve surface characteristics in the composite.

2. Glass Transition Temperature

The cured composite as described here has a high glass transition temperature, generally higher than 125 degrees C. The coefficient of thermal expansion above the glass transition temperature should match as closely as possible to that of the conductive cladding. The necessity for this combination is that during thermal wave soldering the circuit is floated on 500 degrees F. molten solder thereby subjecting the circuit to extreme thermal shock. If the coefficient of thermal expansion of the substrate is significantly different than that of the conductor cracking in plated holes will occur. This is particularly critical where holes are punched or drilled into the substrate and plated so that circuits on the front and back of the substrate may be connected. Such holes are generally referred to as plated-through holes and can experience barrel cracking during solder float. There is a close thermal expansion match between the copper and the composite described in the example.

3. Chemical Resistance

The inherent properties of the formulation as well as the high filler content yield excellent chemical resistance properties in the resultant board. During printed circuit board processing, the printed wiring board is exposed to various chemicals and solvents, such as ammonium persulfate, hydrochloric acid, trichloroethane and methylene chloride. When the printed wiring board is immersed in such chemicals for one-half hour at room temperature no surface damage may be seen by the unaided eye.

4. Moisture Absorption

Measurements on the weight of the substrate before and after 24-hour immersion in water maintained at room temperature indicate very little moisture absorption (<1 percent). Consequently, when high temperature solder is exposed to the substrate, little or no blistering or conductor delamination occurs.

5. Insulation Resistance

The surface characteristics of the printed wiring board and its low water absorption makes for very high insulation resistance. The insulation resistance is measured between two conducting elements 0.025 inches wide formed in an interlocking comb pattern with a comb separation of approximately 0.050 inches (ASTM D257) and is found to be $6 \times 10^5$ megohms after four days of exposure to an environment of 95 degrees F. and 90 percent relative humidity and measured under these conditions. This value is as good as the more costly epoxy laminate wiring board and is better than other polyester laminate wiring boards. It should be noted, however, that at the present time epoxy printed wiring boards cannot use large amounts of filler materials to decrease their cost of fabrication without deterioration of electrical and mechanical properties. In addition to the effect the smooth surface has on improving the insulation resistance of the printed wiring board, a smooth surface also results in lower cost when gold plating is utilized since gold fill-in on the surface may not be required.

6. Peel Strength

The peel strength on the printed wiring board is found to be greater than 2 pounds per inch of conductor width and is adequate for many applications.

7. Mechanical Strength

The flexural strength of the printed wiring board using this technique is 23,000 psi as compared to 75,000 psi for an epoxy glass substrate. However, the 23,000 psi flexural strength is more than adequate for most applications. The flexural modulus is found to be 1.7 million psi and the impact strength 5 foot-pounds; both are more than adequate for envisioned applications.

EXAMPLE 1

In this example a copper-clad composite was fabricated using the molding technique described in the specification. The molding compound was formulated using a sheet molding process. The components of the formulation are listed in Table III.

TABLE III

| | pts by weight (±1%) |
|---|---|
| Resin | 65 |
| isophthalic anhydride based unsaturated polyester resin | |
| Low Profile Additive | 35 |
| polyvinyl acetate | |
| Monomer | 3 |
| styrene-viscosity reducing, crosslinking diluent | |
| Catalyst | 1 |
| 1,1 ditertiary butylperox 3,3,5 dimethyl cyclohexane | |
| Filler | 150 |
| alumina trihydrate treated with silane, acts as flame retardant | |

TABLE III-continued

| | pts by weight (±1%) |
|---|---|
| Viscosity Control Agent | 0.8 |
| magnesium oxide | |
| Chopped Glass Fiber Reinforcement | 30 |
| approximately 12 microns diameter | |

The ingredients in Table III, with exception of the glass, were mixed into a resin formulation using a Cowles-type mixer. The mixed formulation was then put into a holding tank. At this point the viscosity was approximately 3000 cps. From the holding tank, the formulation was metered onto a moving polyethylene film forming a layer approximately one-eighth inch thick. One-inch glass rovings were then deposited uniformly along the resin surface. Simultaneous to this another layer of resin formulation was metered onto a second polyethylene layer film. The polyethylene film with the chopped glass rovings then joined the polyethylene film without the chopped glass rovings to form a sheet molding compound layer comprising the chopped glass rovings sandwiched between the two films of resin formulation. This compound was then passed through kneading rolls where it was mixed while maintaining its sheetlike shape and then wound into a roll and sealed with polyethylene and aluminum foil. The roll was then placed in a maturation room.

The molding compound was kept in the maturation room at a temperature of 95 degrees F. for approximately three days during which time it reached a molding viscosity of approximately 60 million centipoise. Subsequent to reaching the maturation viscosity, the molding compound was cut into five 10"×10" sheets with a total weight of 1000–1250 grams and the polyethylene was removed. A layer of one-ounce copper (1½ mils thick), whose linear dimension was approximately one-fourth inch less than that of the mold, was placed in the bottom of the female member of a closed compression molding apparatus with the treated side up. The mold was a 24-square-inch flat compression mold. The five sheets of sheet molding compound were then placed upon the one-ounce copper inside the female member of the mold. An identical sheet of copper was then placed above the sheet molding compound with the treated side facing the sheet molding compound. The sheet molding compound had a weight of 380 grams per square foot. Prior to insertion of the sheet molding compound the mold was heated to 280 degrees F. The mold was closed in a maximum of 15 seconds and was held at 1000 psi for three minutes. The cavity was then opened and the clad molded composite was blown out with a jet of air. The resultant copper-clad composite was etched approximately to yield a test pattern upon the copper surface. The copper-clad composite was then tested for various electrical, mechanical and physical properties, which properties are summarized in Table IV.

TABLE IV

| | |
|---|---|
| Flexural Strength | $23 \times 10^3$ psi |
| (ASTM D790) | (average of 5 values) |
| Flexural Modulus | $1.7 \times 10^6$ psi |
| (ASTM D790) | |
| Solder Float | no blistering |
| (floated on 500 degrees F. molten solder for 20 seconds) | |
| Peel Strength | 4 lbs/inch |

TABLE IV-continued

| Insulation Resistance | conductor width |
|---|---|
| After 11 days | $2.1 \times 10^5$ megohms |
| Water Absorption | 0.3 percent |
| (after 24-hour immersion in tap water at room temperature) | |
| Profilimeter | 15 microinches rms |
| Glass Transition Temperature | 151 degrees C. |

I claim:

1. A process for producing conductor-clad printed wiring board composites comprising,
   placing a quantity of substantially uncured polymeric molding compound in a heated compression molding apparatus;
   compression molding and curing the compound; the invention characterized in that
   (a) the linear dimensions of the molding compound charge placed within the molding apparatus are less than the interior linear dimensions of the mold face upon which it is placed,
   (b) a conductive foil of thickness less than 7 mils is placed upon, and supported by, the molding charge, prior to molding,
   (c) the linear dimensions of the conductive foil are less than the interior linear dimensions of the mold face, but greater than the linear extent of the molding compound charge,
   (d) the compound is caused to flow during the molding process,
   (e) the molding compound is constrained by the mold walls when the mold is closed, and
   (f) the foil is smooth to within 20 microinches rms subsequent to molding,
   whereby a conductor-clad composite is formed.

2. The process of claim 1 wherein the conductive foil is a copper foil.

3. The process of claim 1 wherein the molding compound comprises
   (1) between 60 and 80 parts by weight thermosetting polymeric resin;
   (2) between 0.5 and 60 parts by weight monomer;
   (3) between 0.5 and 3 parts by weight catalyst; and
   (4) between 100 and 200 parts by weight filler.

4. The process of claim 3 wherein the molding compound further comprises at least 20 parts by weight discrete reinforcement filaments less than 4 inches in length.

5. The process of claim 1 wherein the molding compound is a sheet molding compound.

6. The process of claim 1 wherein the molding compound is a bulk molding compound.

7. The process of claims 2 through 4 wherein the molding compound placed within the mold covers between 30 and 90 percent of the mold surface when inserted.

8. The process of claim 7 wherein the linear dimensions of the copper foil are between 99.9 and 95 percent of the internal linear dimensions of the mold face upon which it is placed.

9. The process of claim 8 wherein a copper foil is placed on an interior face of the mold prior to placement of the charge of molding compound and a second copper foil is placed upon the molding compound subsequent to the placement of the compound within the mold and prior to compression of the molding compound.

10. The process of claims 2 through 4 wherein the compound comprises a resin which is selected from the group consisting of isophthalic anhydride based unsaturated polyester resins, vinyl ester based resins, orthophthalic anhydride based unsaturated polyester resins and bisphenol based polyester resins.

11. The process of claim 4 wherein the compound further comprises from 15 to 40 parts by weight low profile additive.

12. The process of claim 11 wherein the low profile additive is a polyvinyl acetate low profile additive.

13. The process of claim 11 wherein the monomer is styrene.

14. The process of claim 13 wherein the compound further comprises 0–5 parts by weight viscosity control agent.

15. The process of claim 14 wherein the viscosity control agent is magnesium oxide.

16. The process of claim 15 wherein the conductive foil is a copper foil.

17. The process of claims 2 and 16 wherein a circuit pattern is defined on the conductive foil subsequent to the molding.

* * * * *